United States Patent [19]

Minoura

[11] Patent Number: 5,038,050

[45] Date of Patent: Aug. 6, 1991

[54] JUNCTION RELAY BOX

[75] Inventor: Takayoshi Minoura, Northville, Mich.

[73] Assignee: Yazaki Eds, Canton, Mich.

[21] Appl. No.: 429,570

[22] Filed: Oct. 31, 1989

[51] Int. Cl.[5] .................... H05K 1/18

[52] U.S. Cl. .................... 307/10.1; 361/357; 361/430; 439/621

[58] Field of Search .................... 307/10.1, 9.1, 10.7, 307/147; 361/346-349, 357, 360, 393, 396, 426, 430, 431; 439/34, 620-622

[56] References Cited

U.S. PATENT DOCUMENTS

| | | | |
|---|---|---|---|
| 2,707,761 | 5/1955 | Page | 361/353 |
| 2,968,785 | 1/1961 | Kallenborn | 439/359 |
| 3,192,445 | 6/1965 | Evans et al. | 361/394 |
| 3,341,745 | 9/1967 | Munro | 361/349 |
| 3,372,308 | 3/1968 | Noschese et al. | 361/425 |
| 3,386,010 | 5/1968 | Nojiri | 361/392 |
| 3,492,628 | 1/1970 | Matthews | 439/81 |
| 4,103,985 | 8/1978 | Krolak et al. | 439/367 |
| 4,208,080 | 6/1980 | Teagno | 439/45 |
| 4,221,455 | 9/1980 | Cairns et al. | 439/355 |
| 4,238,140 | 12/1980 | Cairns et al. | 439/595 |
| 4,355,853 | 10/1982 | Kourimsky | 439/65 |
| 4,429,943 | 2/1984 | Inoue | 439/721 |
| 4,460,239 | 7/1984 | Inoue | 439/786 |
| 4,530,561 | 7/1985 | Tyree et al. | 439/570 |
| 4,555,638 | 11/1985 | Lobe | 307/10.1 |
| 4,689,718 | 8/1987 | Maue et al. . | |
| 4,717,791 | 1/1988 | Mather | 174/35 R |
| 4,799,893 | 1/1989 | Ogawa et al. | 439/76 |

*Primary Examiner*—Todd E. DeBoer
*Assistant Examiner*—David Osborn
*Attorney, Agent, or Firm*—Krass & Young

[57] ABSTRACT

In a combination junction box/fuselink relay box system comprising separate junction and fuselink relay boxes adapted to be mechanically coupled, the junction box and fuselink relay box are each provided with complementary fuselink socket portions which mate to form a common fuselink socket when the junction box and fuselink relay box are coupled. A fuselink inserted in the common socket provides direct electrical connection between the junction and fuselink relay boxes, eliminating the need for intermediate wire connection between the junction box and fuselink relay box.

3 Claims, 2 Drawing Sheets

FIG - 1
PRIOR ART
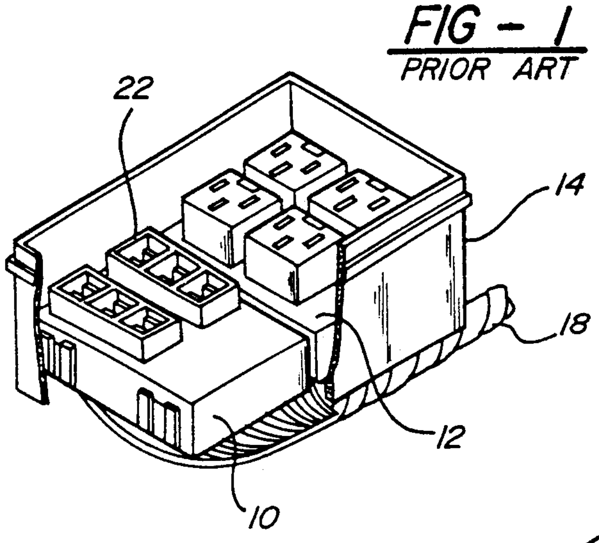
FIG - 3
PRIOR ART
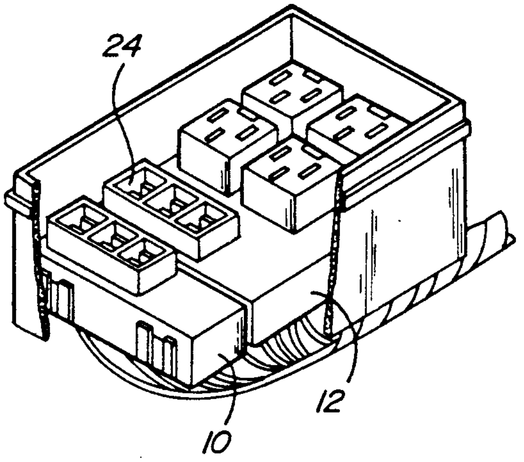
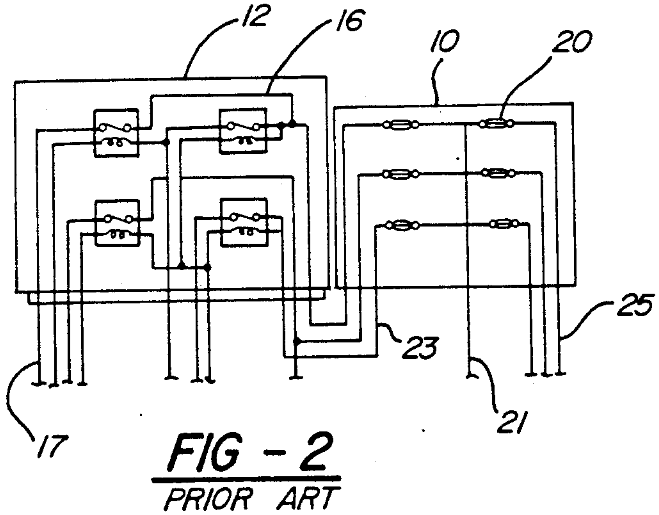
FIG - 2
PRIOR ART
FIG - 4
PRIOR ART
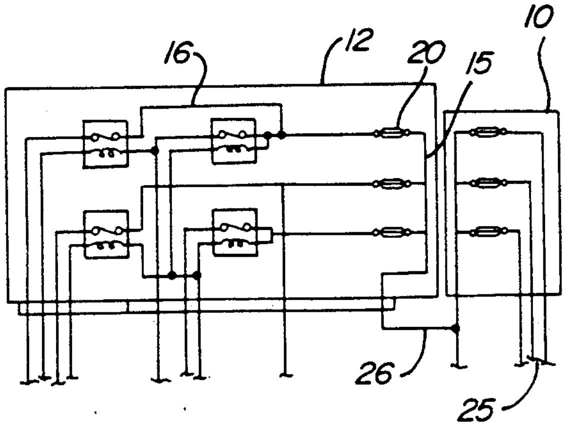

FIG - 5
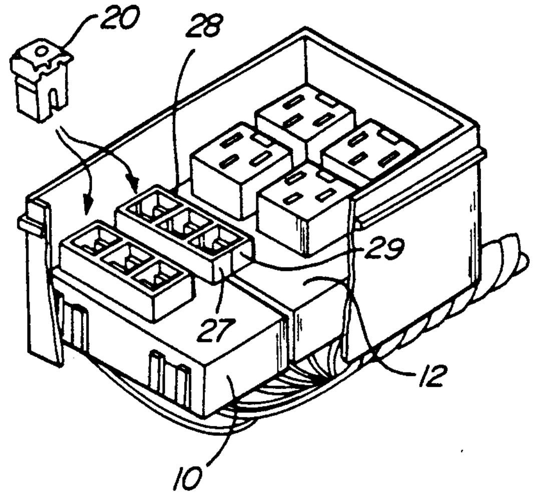
FIG - 6
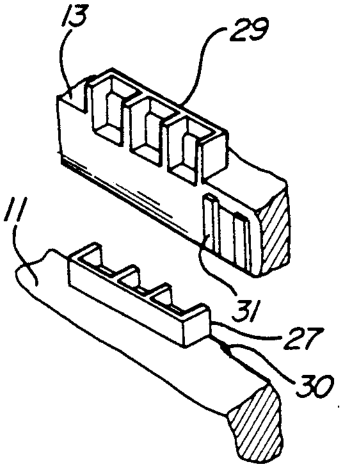
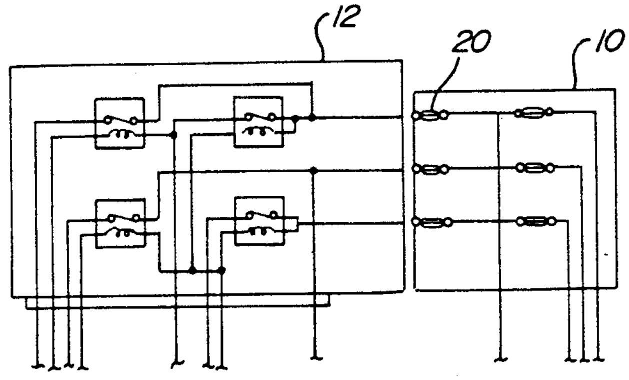
FIG - 7
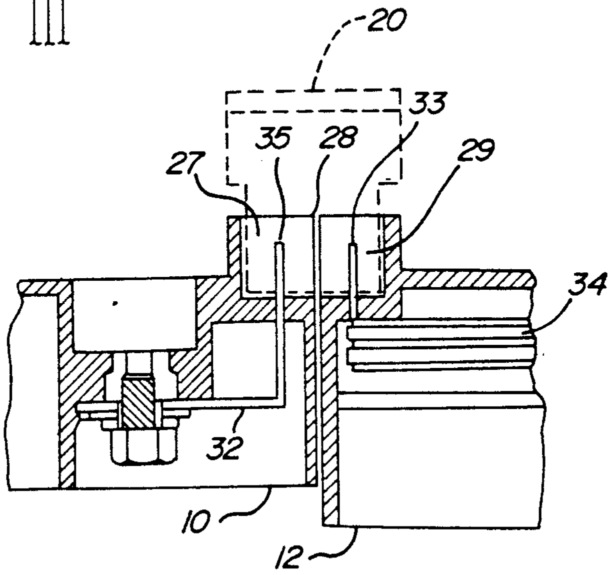
FIG - 8

JUNCTION RELAY BOX

FIELD OF THE INVENTION

This invention relates to junction box and fuselink relay box systems for vehicles, and in particular to a combination junction/fuselink relay box.

BACKGROUND OF THE INVENTION

Automobiles typically are provided with a variety of separate electrical systems, accessories, and options, resulting in the need for a substantial amount of wiring. The automotive industry is constantly seeking ways to reduce the amount, complexity and cost of this wiring in order to reduce the overall cost of producing an automobile.

With the introduction of junction box technology, the wiring of an automobile was simplified since the junction box provided a plurality of pre-wired circuits for centralized distribution of electrical signals to the various electrical systems and accessories. Likewise, the introduction of fuse or fuselink relay boxes simplified wiring by providing a centralized terminal for the fuses or fuselinks necessary to protect the various vehicle systems and circuits from current overloads.

Typically, a junction box (JB) is provided with its own corresponding fuselink relay box (FRB), and the JB and FRB are electrically connected by some sort of intermediate wiring. Prior art JB/FRB systems can generally be divided into two categories: those in which the fuselinks (FL) for the JB circuits are mounted on the FRB, and those in which the fuselinks for the JB circuits are fully incorporated in or mounted on the JB itself. A disadvantage inherent in the first category is the need for a plurality of intermediate wire connections between the fuselinks on the FRB and corresponding circuits on the JB. In view of the need for a reduction in the amount of wiring in the vehicle, this arrangement is less than ideal.

In the second category of prior art JB/FRB systems, in which the JB incorporates its own fuselinks, an additional busbar must be inserted or built into the JB to provide source current for the fuselinks, thereby increasing the size, complexity, and cost of manufacturing the JB. Additionally, a wire connection between the FRB and JB is still needed to supply current to the source busbar.

It is generally not practical to make the JB and FRB integral; i.e., to accommodate fuselink circuitry, wiring and other FRB structure in the JB in addition to the circuits already contained therein. Such addition would require a considerable increase in the size of the JB and in the complexity of manufacturing. Also, the heat generated by such a dense concentration of circuitry, wiring, busbars, fuselinks, etc., would be likely to damage the JB circuits.

In view of the need for a minimum of wiring in the electrical systems of vehicles, and in view of the disadvantages of prior art JB/FRB systems, it is therefore desirable to provide a JB/FRB system in which wire connection between the JB and FRB is eliminated without substantial increase in the size of complexity or the JB.

SUMMARY OF THE INVENTION

The present invention is a JB/FRB system in which the JB and the FRB are combined without the need for intermediate wire. This is generally accomplished by providing the JB and FRB with complementary fuselink-receiving structure which, when the JB and FRB are mechanically coupled, allows the fuselink itself to provide electrical connection between the JB and FRB.

The JB and FRB are provided with coupling structure which allows two corresponding side surfaces to be mated, for example in a snap-fit. One half of a fuselink socket structure is formed in the FRB at the edge mated with the JB, and the other complementary half of the fuselink socket structure is formed on the JB at the edge adapted to be mated with the FRB. When the mating edges of the JB and FRB are coupled, the complementary halves of the fuselink socket structure are aligned to create a complete, common socket shared by the JB and FRB. When a fuselink is inserted in this common socket, it physically and electrically bridges the junction of the FRB and JB, eliminating the need for wire connection therebetween.

In the illustrated embodiment, the fuselinks are two-pronged. The complementary socket structure on the FRB includes a contact portion of a source busbar in the FRB, and the complementary socket structure of the JB includes a contact for a load busbar within the JB. When the fuselink is inserted in the assembled common socket, one of the fuselink prongs contacts the FRB source busbar contact in the FRB half of the socket, and the other prong contacts the JB load busbar contact in the JB half of the socket, thereby electrically connecting the respective FRB and JB circuits.

The separation of the fuselink socket into complementary mating halves formed on the FRB and JB is an economical and efficient solution to a problem which until now has not been satisfactorily addressed by the prior art. Other advantages and features of the invention will become apparent upon further reading of the specification.

BRIEF DESCRIPTION OF THE INVENTION

FIG. 1 is a perspective view of one prior art embodiment of a JB/FRB system;

FIG. 2 is a schematic circuit diagram of the JB/FRB system of FIG. 1;

FIG. 3 is a perspective view of another prior art embodiment of the JB/FRB system;

FIG. 4 is a schematic circuit diagram of the JB/FRB system of FIG. 3;

FIG. 5 is a perspective view of a JB/FRB system according to the present invention;

FIG. 6 is a perspective view of the complementary socket structure of the system of FIG. 5;

FIG. 7 is a schematic circuit diagram of the JB/FRB system of FIG. 5; and FIG. 8 is a cross-section side view of the mated complementary socket structure of the JB/FRB system of FIG. 5.

DETAILED DESCRIPTION OF THE ILLUSTRATED EMBODIMENTS

Referring now to FIGS. 1 and 2, an embodiment of a prior art JB/FRB system comprising FRB 10 and JB 12 is shown, with the JB and FRB mounted side by side in a common housing 14. JB 12 is of a type well-known in the art, with a number of printed circuits 16 contained therein and connected via wires 17 to various vehicle systems to distribute electrical signals thereto. Suitable wire harness connector structure 18 is formed on the outer surface of the JB for receiving plug-in wire harnesses from various vehicle systems.

FRB 10 supports a plurality of fuselinks 20 in socket structure 22. Fuselinks 20 are connected in parallel and receive electrical current via line 21 from a vehicle current source (not shown), conducting the current to the circuits 16 of JB and to other various vehicle systems via wires 23 and 25, respectively. Fuselinks are well-known in the art for preventing current overloads from being delivered to circuits and electrical systems, and accordingly will not be explained in further detail.

The prior art JB/FRB system embodiment of FIGS. 1 and 2 requires intermediate wire connections 23 between the JB and FRB for each fuselink protecting a load or circuit in the JB.

Referring now to FIGS. 3 and 4, a second prior art embodiment is shown wherein the fuselinks connected to the JB circuits 16 are shown mounted in sockets 24 incorporated fully in the JB. The remaining fuselinks mounted on FRB 10 are connected to various other loads (via lines 25). To supply fuselinks 20 on JB 12 with source current, a busbar 15 has been added to the internal structure of the JB. Since this busbar is common to all of the fuselinks mounted on the JB and therefore bears a substantial electric current, it must be fairly wide, substantially increasing the size of the JB as can be seen by a side-by-side comparison of FIGS. 1-2 and FIGS. 3-4. Moreover, a wire connection 26 is still required between the FRB and the JB source busbar 15 to provide current for the circuits of the JB. This wire connection 26 increases the weight, cost, and complexity of the system and further requires the addition of structure to the JB for fastening wire 26 to busbar 15.

A combined JB/FRB system according to the present invention is shown in FIGS. 5-8. Referring to FIGS. 5 and 6, common fuselink structure 28 is formed at the junction of the JB and FRB comprising complementary FRB and JB socket portions 27 and 29. Each socket portion 27 and 29 is the complementary half of the other which, when the JB and FRB are aligned as shown in FIG. 5, combine to form a common socket structure for one or more fuselinks 20. As can be seen in the drawings, complementary socket portions 27 and 29 together form three common sockets for receiving fuselinks 20; however, it will be understood that any number of sockets may be provided for.

As shown in FIG. 6, the mating sides 11 and 13 of the FRB and JB, respectively, are provided with mechanical locking structure 30 in the form of a clip portion (not shown) adapted to be removable lockingly inserted in sheath 31 on the JB. This locking structure serves to securely mechanically couple the JB and FRB and to align the complementary JB and FRB socket portions 27 and 29. When the JB and FRB have been mechanically coupled by way of locking structure 30, complementary socket portions 27 and 29 are automatically aligned or matched up to form a common socket structure shared by the JB and FRB.

Referring to FIG. 7, the schematic circuit diagram of the JB/FRB system of FIG. 5 is shown. It can be seen that fuselinks 20 require no wire connections whatsoever to establish electrical contact between the current source in FRB 10 and the loads in JB 12; fuselinks 20 not only serve to protect the load circuits to which they are connected, but they simultaneously electrically connect the JB and FRB. This elimination of intermediate wire connection between the FRB and JB reduces manufacturing complexity, and cost and system weight.

Referring now to FIG. 8, the junction of the JB/FRB combination of FIG. 5 is shown in cross-section. FRB socket portion 27 and JB socket portion 29 have been mated as previously described to form common socket structure 28 at the junction of FRB 10 and JB 12. FRB socket portion 27 contains a contact 35 connected internally of FRB 10 to a source busbar 32, and JB socket portion 29 contains a contact 33 connected internally of JB 12 to one or more load busbars 34. Two-pronged fuselink 20 is inserted into the common socket 28, with one prong in contact with FRB socket portion contact 35 and the other in contact with JB socket portion contact 33. FRB 10 and JB 12 are mechanically coupled by way of the locking structure shown in FIG. 6 and electrically coupled by fuselink 20. There is no need for any wiring between the JB and FRB, resulting in a less complicated, more cost-efficient, lighter system.

It will be understood that the foregoing description is of an illustrated embodiment and is not intended to limiting, as many modifications and variations of the JB/FRB system of the present invention are possible within the scope of the appended claims. For example, the fit of the fuselink in the assembled JB and FRB socket portions could be toleranced tightly enough so that the fuselink provides both mechanical and electrical connection between the JB and FRB; i.e., the JB and FRB would be held together by the fuselink 20 rather than locking structure 30. Also, the complementary JB and FRB socket portions may take almost any shape or form, depending on the type of fuselink used. Other modifications and changes within the scope of the appended claims will be apparent to those skilled in the art.

We claim:

1. A combination junction/fuselink relay box for vehicles comprising:

a junction box having a plurality of circuits for centralized distribution of electrical signals to various vehicle accessories;

a fuselink relay box;

a complementary locking structure formed on said junction box and said fuselink relay box for releasably coupling said junction box and said fuselink relay box;

a first complementary fuselink socket portion formed on said fuselink relay box;

a second complementary fuselink socket portion formed on said junction box; wherein, said first and second complementary fuselink socket portions form a common fuselink socket when said fuselink relay box and said junction box are coupled, such that said fuselink relay box and said junction box are electrically connected by a fuselink inserted in said common socket.

2. Apparatus as defined in claim 1 wherein said fuselink comprises first and second electrical contacts, said first contact contacting a source contact formed in said first complementary fuselink socket portion and said second contact contacting a load contact in said second complementary socket portion when said fuselink is inserted in said common socket.

3. Apparatus as defined in claim 1 wherein a plurality of first and a plurality of second socket portions form a plurality of said common sockets when said junction and fuselink relay boxes are coupled.

* * * * *